United States Patent
Fukuyoshi et al.

(10) Patent No.: US 6,950,140 B2
(45) Date of Patent: Sep. 27, 2005

(54) SOLID IMAGE-PICKUP DEVICE HAVING A MICRO LENS ARRAY AND METHOD OF MANUFACTURING THE SAME

(75) Inventors: Kenzo Fukuyoshi, Tokyo (JP); Tadashi Ishimatsu, Tokyo (JP); Satoshi Kitamura, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 791 days.

(21) Appl. No.: 09/768,454

(22) Filed: Jan. 25, 2001

(65) Prior Publication Data

US 2001/0009442 A1 Jul. 26, 2001

(30) Foreign Application Priority Data

Jan. 26, 2000 (JP) ........................................ 2000-017329

(51) Int. Cl.[7] ........................ H04N 5/225; H01L 31/062
(52) U.S. Cl. ........................................ 348/340; 257/294
(58) Field of Search ................................ 348/335, 340, 348/294, 302, 311; 257/294, 432, 216; 359/618, 619, 626

(56) References Cited

U.S. PATENT DOCUMENTS

| | | | | |
|---|---|---|---|---|
| 5,239,412 A | * | 8/1993 | Naka et al. | 359/619 |
| 5,583,354 A | * | 12/1996 | Ishibe | 257/232 |
| 6,043,481 A | * | 3/2000 | Tan et al. | 250/216 |
| 6,069,350 A | * | 5/2000 | Ohtsuka et al. | 250/208.1 |
| 6,163,407 A | * | 12/2000 | Okazaki et al. | 359/619 |
| 6,188,094 B1 | * | 2/2001 | Kochi et al. | 257/232 |
| 6,271,103 B1 | * | 8/2001 | Lee | 438/464 |
| 6,307,243 B1 | * | 10/2001 | Rhodes | 257/432 |
| 6,414,343 B1 | * | 7/2002 | Kondo et al. | 257/294 |
| 6,583,438 B1 | * | 6/2003 | Uchida | 257/59 |
| 6,639,726 B1 | * | 10/2003 | Campbell | 359/619 |

FOREIGN PATENT DOCUMENTS

| | | | | |
|---|---|---|---|---|
| JP | 60-53073 | | 3/1985 | |
| JP | 04275459 A | * | 10/1992 | ........... H01L/27/14 |
| JP | 5-48057 | | 2/1993 | |
| JP | 05145813 A | * | 6/1993 | ........... H04N/5/225 |
| JP | 6-112459 | | 4/1994 | |
| JP | 9-45884 | | 2/1997 | |
| JP | 2723686 | | 3/1998 | |

* cited by examiner

Primary Examiner—Wendy R. Garber
Assistant Examiner—Justin Misleh

(57) ABSTRACT

A photovoltaic element, a light shielding portion, a planarized layer, a color filter, another planarized layer and an undercoat layer are formed successively on a semiconductor substrate, followed by forming resin lenses. The undercoat layer positioned between adjacent resin lenses is subjected to an etching treatment with the resin lenses used as a resist mask so as to form ditches extending in the X- and Y-directions and other ditches extending in the XY-direction. Further, a transparent resin layer having a predetermined thickness is formed to cover the resin lenses and the ditches, thereby obtaining a solid image-pickup device comprising a micro lens array including a plurality of micro lenses.

16 Claims, 3 Drawing Sheets

SOLID IMAGE-PICKUP DEVICE HAVING A MICRO LENS ARRAY AND METHOD OF MANUFACTURING THE SAME

CROSS-REFERENCE TO RELATED APPLICATIONS

This application is based upon and claims the benefit of priority from the prior Japanese Patent Application No. 2000-017329, filed Jan. 26, 2000, the entire contents of which are incorporated herein by reference.

BACKGROUND OF THE INVENTION

The present invention relates to a solid image-pickup device represented by a C-MOS, a CCD, etc. and a method of manufacturing the same, particularly, to a solid image-pickup device that permits improving the sensitivity and suppressing the smear by increasing the effective opening rate of a micro lens and a method of manufacturing the same.

The solid image-pickup device comprises the regions contributing to passing the light trough the light receiving element and opto-electric conversion, hereinafter referred to each of the regions as "open portion". In general, the sensitivity of the light receiving element depends on the size of the open portion. In other words, the small open portion leads to a low sensitivity. The open portion of the light receiving element such as a CCD is limited to about 20 to 40% of the entire area of the element. In general, the sensitivity is increased by forming a micro lens with height opening rate on a light receiving element, in addition to the measure for increasing the open portion as much as possible, because the micro lens with height opening rate improves the light collection. Note that opening rate of a lens is defined as the ratio of the area of the plan view of a micro lens to the square of the pitch between the adjacent micro lenses.

In recent years, a high precision solid image-pickup device having more than 2,000,000 pixels is being propagated. In such a high precision solid image-pickup device, plurality of miniaturized light receiving elements are arranged densely. Consequently, the reduction of the opening rate based on the miniaturization of the light receiving element and the reduction in sensitivity accompanying the reduction in the opening rate are prominent.

As described above, the micro lens is useful means to improve the opening rate of the solid image-pickup device. The high precision solid image-pickup device having more than 2,000,000 pixels requires the arrangement of the micro lenses at a pitch not larger than 5 $\mu$m and not larger than 0.3 $\mu$m of the gap between the adjacent micro lenses, hereinafter referred to as "a lens gap". However, the micro lens is formed in general by utilizing in combination the photolithography using a photosensitive resin and a heat flow technology. Because of the restrictions of these technologies, the lens gap in the side direction of the micro lens is about 1 $\mu$m to at most about 0.4 $\mu$m. If the lens gap is made 0.3 $\mu$m or less in heat flow process, the adjacent micro lenses are connected to each other at the lens edge and the nonuniformity of the photosensitive resin tends to occur, resulting in failure to provide a stable production technology of a mass production level. The restrictions inherent in the prior art described above lead to the lens gap larger than 0.3 $\mu$m. That is, it is one of the important subjects that the reduction in the opening rate of the micro lens accompanying the high precision of the solid image-pickup device, in other words, the sensitivity of the solid image-pickup device is lowered.

Concerning conventional formation of the micro lens, various technologies are disclosed in, for example, Japanese Patent Disclosure (Kokai) No. 60-53073 and Japanese Patent Disclosure No. 5-48057. The technology of the formation of the micro lens disclosed therein is following.

Japanese Patent Disclosure No. 60-53073 discloses the technology of forming a lens hemispherical by utilizing the heat flowability (heat flow) of resin caused by the heat flow. Also disclosed in detail is the technology of working a lens by some etching technologies. In addition, disclosed is formation of an organic film such as PGMA and an inorganic film such as OCD ($SiO_2$ series) on the lens surface.

Each of Japanese Patent Disclosure No. 5-48057 and Japanese Patent Disclosure No. 60-53073 discloses the technology of laminating a thin film on a resin lens, said thin film differing from the lens material in the refractive index. Specifically, Japanese Patent Disclosure No. 5-48057 discloses the depositing method using CVD of, for example, ECR plasma, the method isotropically depositing an inorganic film or a resin film on a resin lens to perform a small gap between lenses and improve the opening rate of the lenses. In general, the method of synthetic vapor deposition for depositing, for example, a urea resin by using a vapor deposition machine is also useful to perform a small gap between lenses.

However, these prior arts necessitate a costly vacuum apparatus and a CVD apparatus and are not simple process, leading to a marked increase in the manufacturing cost.

As a stable production technology capable of improving the light collection or as a production technology capable of forming the shape between the adjacent micro lenses, Japanese Patent Disclosure No. 60-53073 referred to previously, Japanese Patent Disclosure No. 6-112459 and Japanese Patent Disclosure No. 9-45884 disclose a technology called trench system utilizing an etching. These technologies certainly make it possible to product a concave lens by forming a concave portion between adjacent micro lenses and the edge of the concave portion circular.

However, in the trench system, it is difficult to form a small gap between the adjacent micro lenses not larger than 0.3 $\mu$m. This is the reason why the trench system is the technology to form a concave portion by etching such as a dry etching with a micro lens used as a matrix, the lens is basically shaped moderate and, at the same time, the etching is performed such that the concave portion is widened. In other words, the trench system is not basically directed to the technology in such a manner to perform the small gap between the adjacent micro lenses by etching such as a isotropic etching or an anisotropic etching with a micro lens used as a matrix.

BRIEF SUMMARY OF THE INVENTION

An object of the present invention, which has been achieved in view of the above-noted problems inherent in the prior art, is to provide a solid image-pickup device comprising high opening rate micro lenses and the gap between the adjacent the micro lenses and a method of manufacturing the same.

According to a first aspect of the present invention, there is provided a solid image-pickup device, comprising: a micro lens array formed by arranging a plurality of resin lenses in a manner to form a matrix; an undercoat layer for fixing the micro lens array and having a ditch formed between the adjacent resin lenses; and a transparent resin layer covering the plural resin lenses with substantially the same thickness and the ditch between the adjacent resin lenses.

According to a second aspect of the present invention, there is provided a solid image-pickup device, comprising: a micro lens array formed by arranging a plurality of resin lenses in a manner to form a matrix; an undercoat layer for fixing the micro lens array and having a ditch formed between adjacent micro lenses not larger than 0.3 µm; and a transparent resin layer covering the plural resin lenses and the ditch, wherein the difference between the height of the surface of the transparent layer in the ditch in the diagonal direction of the lens array and the height of the tops of micro lenses each consisting of the resin lens and the transparent resin layer covering the surface of the resin lens is larger than the difference between the height of the surface of the transparent layer in the ditch in the arranging direction of the lens array and the height of the top of the micro lens.

According to a third aspect of the present invention, there is provided a method of manufacturing a solid image-pickup device, comprising the steps of: forming a photosensitive resin layer on an undercoat layer; exposing the photosensitive resin layer to light in a predetermined pattern, followed by a developing treatment so as to form a resin pattern layer having a predetermined gap width; subjecting the resin pattern layer to a heat flow so as to form resin lenses; applying an etching treatment to those portions of the undercoat layer which are exposed in regions between adjacent resin lenses to form ditches; and forming a transparent resin layer on the surfaces of the resin lenses and the undercoat layer.

According to the construction defined in the present invention, it is possible to provide a solid image-pickup device comprising high opening rate micro lenses and the gap not larger than 0.3 µm between the adjacent the micro lenses and a method of manufacturing the same. In addition, it is possible to improve the light collecting effect in the diagonal direction of the micro lens array and to eliminate the lowering of the characteristics of the solid image pickup element caused by the light reflection in the flat portion between the micro lenses in the diagonal direction. As a result, it is possible to provide a solid image pickup element capable of improving the sensitivity and suppressing the smear.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
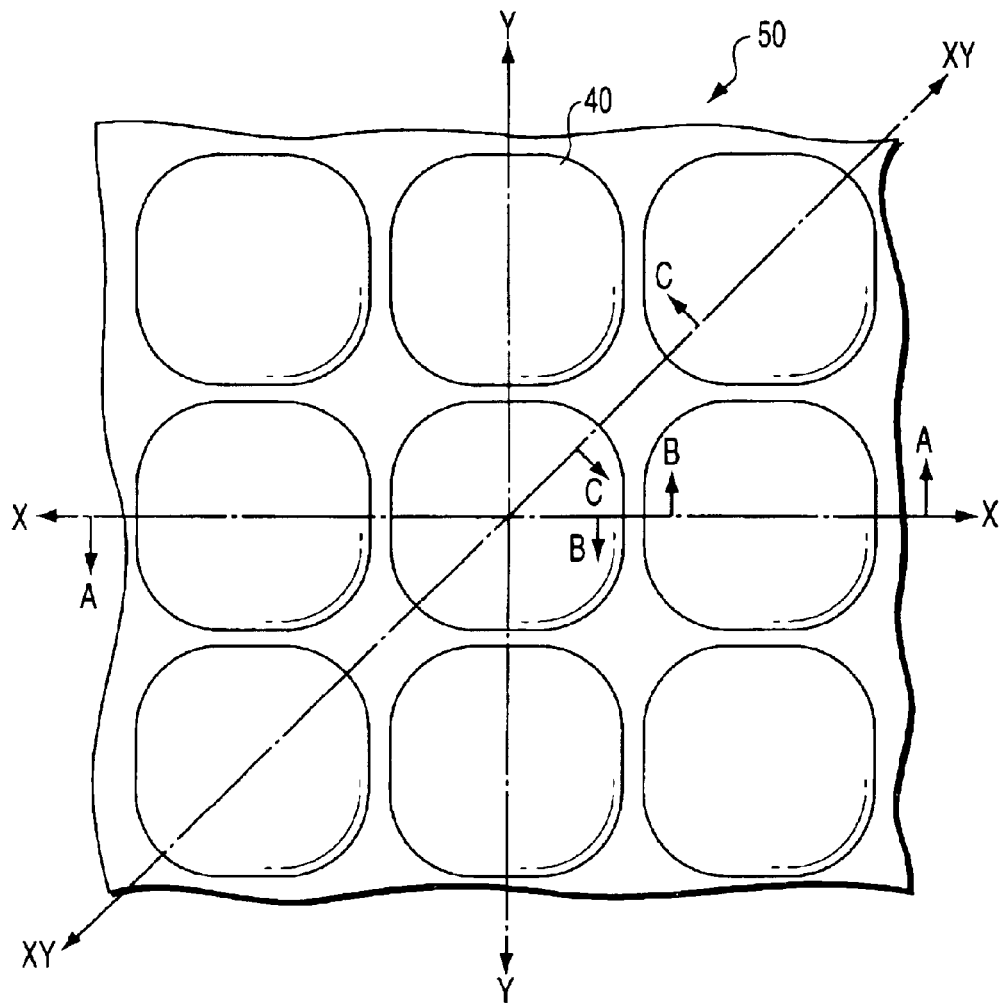
FIG. 1 is a plan view partly showing a solid image-pickup device according to one embodiment of the present invention.

Some embodiments of the present invention will now be described with reference to the accompanying drawings. In the following description, the constituents of the present invention having substantially the same function and construction are denoted by the same reference numerals so as to avoid an overlapping description, though an overlapping description is repeated where necessary.

First of all, the construction of a solid image-pickup device of the present invention will be described with reference to the accompanying drawings.

Figure 2:
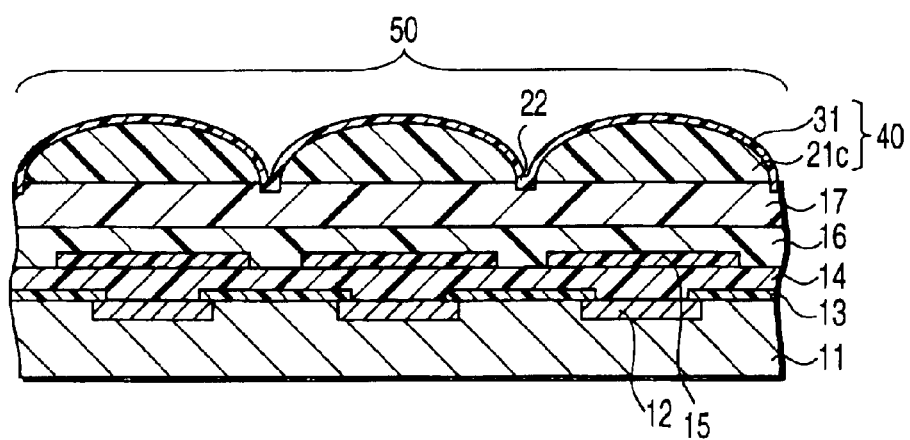
FIG. 2 is a cross sectional view schematically showing the solid image-pickup device along the line A—A shown in FIG. 1.

FIG. 1 is plan view showing a part of a solid image-pickup device according to one embodiment of the present invention, and FIG. 2 is a cross sectional view along the line A—A shown in FIG. 1. Note that, in the present description, the array direction or the side direction is defined as X- or Y-direction shown in FIG. 1. In addition, the diagonal direction is defined as XY-direction shown in FIG. 1.

As shown in FIGS. 1 and 2, the solid image-pickup device of the present invention comprises a photovoltaic element 12 as a light receiving element, a light shielding section 13, a planarized layer 14, a color filter 15, a planarized layer 16, and an undercoat layer 17, which are formed on a semiconductor substrate 11, a micro lens 40 including a resin lens 21c and a transparent resin layer 31, and a micro lens array 50.

The solid image-pickup device of the present invention is featured in particularly the constructions of the undercoat layer 17, the resin lens 21c and the transparent resin layer 31 as described in the following. It is possible to use the other constituents similar in construction to those used in the ordinary solid image-pickup device.

Each of the undercoat layer 17, the resin lens 21c and the transparent resin layer 31 is formed of at least one of resins having a high transparency in the visible region and a practical reliability such as a heat resistance, a light resistance, and a resistance to heat cycles. For example, it is possible to use an acrylic resin, an epoxy resin, a polyester resin, an urethane resin, a melamine resin, a urea resin, a phenolic resin, and copolymers thereof for forming the undercoat layer 17 etc. In general, a phenolic photosensitive resin or a melamine-epoxy copolymer having a low molecular weight is used for forming the undercoat layer 17, etc.

It is desirable for the undercoat layer 17 to be formed of a transparent resin having an etching rate higher than that of the resin lens 21c in view of the manufacturing process described herein later.

As shown in FIGS. 1 and 2, the resin lenses 21c are arranged on the undercoat layer 17 to form a matrix. About square resin lenses 21c are shown in the drawings of the plain view. However, the shape of the resin lens 21c is irrelevant to the technical idea of the present invention. For example, it is possible for the resin lens 21c to be circular in the plain view.

The undercoat layer 17 serves to protect the layers positioned below the undercoat layer 17 and to hold stationary each of the resin lenses 21c. As shown in FIG. 2, the greatest feature of the undercoat layer 17 resides in that ditches 22 are formed between adjacent resin lenses 21c. The ditch 22 plays the role of preventing the transparent resin layer 31 between adjacent resin lenses 21c from becoming unduly thick in the step of forming the transparent resin layer 31 by the method described herein later.

It is desirable that the ditch 22 is formed in a depth falling within a range of between 0.05 µm and 1.5 µm.

Figure 3A:
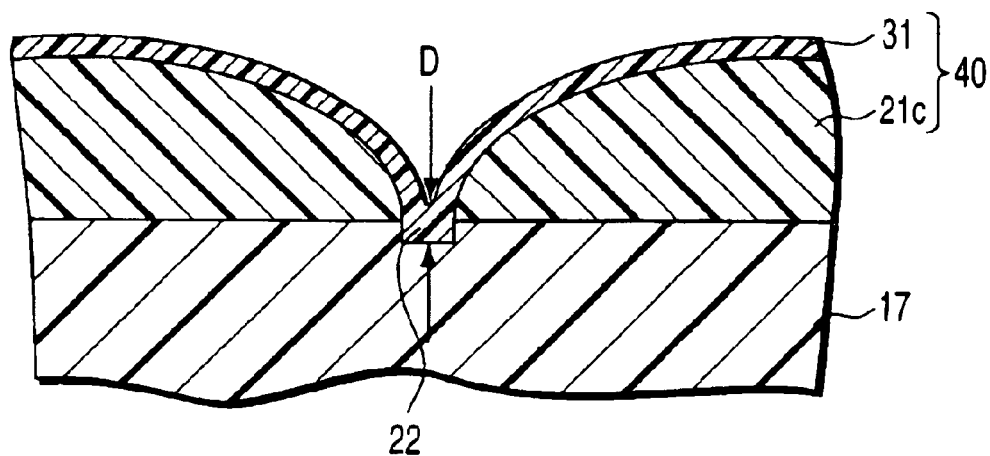
FIG. 3A is a cross sectional view along the line B—B shown in FIG. 1.
Figure 3B:
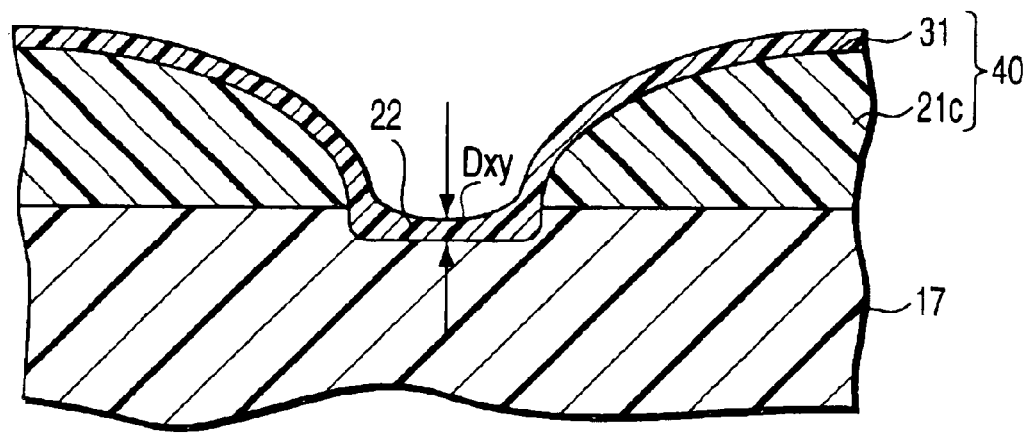
FIG. 3B is a cross sectional view along the line C—C shown in FIG. 1.

The transparent resin layer 31 is a thin layer covering each of the resin lenses 21c and the exposed undercoat layer 17. The resin lens 21c and a part of the transparent resin layer 31 positioned to cover the resin lens 21c collectively form a micro lens 40 as shown in FIGS. 2, 3A and 3B. Specially, shown in FIGS. 2 and 3A, the portion of the transparent resin layer 31 formed in the ditch 22 serves to narrow the gap between adjacent micro tenses 40. Also, that portion of the transparent resin layer 31 which is positioned on the resin lens 21c serves to increase the area of the light receiving region.

It is desirable that the thickness of the transparent resin layer 31 is no more than, for example, 0.3 μm. It is easy to the thickness of the transparent resin layer 31 described above to retain the shape of the resin lens 21c and perform the narrow the gap between adjacent micro lenses 40. On the other hand, it is difficult to the transparent resin layer 31 having the thickness more than for example, 0.4 μm to reproduce the shape of the resin lens 21c and bury. This is the reason why the transparent resin layer 31 buries the gap between the adjacent resin lenses 21c to form flat, so that it is hard to perform the narrow the gap between adjacent micro lenses 40 in spite of etching treatment.

Furthermore, It is desirable that the thickness of the transparent resin layer 31 is no less than, for example, 0.01 μm because of the following reason. In general, when an organic resin thin film having a thickness not larger than 0.3 μm is formed the general coating method of a low cost such as a spin coating method, it is necessary to decrease the solid resin ratio or markedly decrease the viscosity of the coating solution. However, if the solid resin ratio is decreased, it is impossible to form a homogeneous film when the coated solution is dried. To be more specific, the resin component is agglomerated to form lands in the drying step. Alternatively, the resin solution, which is thin, is rendered unstable, with the result that the resin is already agglomerated within the solvent. Under the circumstances, according to the inventors experiments, it is possible to form a uniform film in the drying the coated solution step, by the general coating method of a low cost such as a spin coating method, if the lower limit in the thickness of the transparent resin coating layer should practically be 0.01 μm. Therefore, from point of view on the practice, it is desirable that the lower limit in the thickness of the transparent resin layer 31 formed by the general coating method is set 0.01 μm.

Incidentally, the thickness of the transparent resin layer 31 can be controlled by controlling the properties of the coating solution. This control of the thickness of the transparent resin layer 31 enable to adjust the smear amount and the lens aberration of micro lenses 40 to some extent. Also, in the case of employing a resin having a strong agglomeration capability as a transparent resin, it is possible to emphasize the micro lens 40 shape or to increase the curvature of the micro lens 40. It is also possible to control to some extent the light reflection from the lens surface by adjusting the refractive index of the transparent resin. For example, in the case of using a transparent resin having a refractive index equal to that of the resin lens 21c, the lens can be designed easily.

A description will now be given of the specific function of the ditches 22.

In general, the resin lens 21c is formed by utilization of heat flow (a specific process will be described later with reference to the steps shown in FIGS. 4B and 4C). When the heat flow is utilized, the resin lens 21c tends to be thinner and smoother in the XY direction (the diagonal direction of the lens array) shown in FIG. 1 than in the X and Y directions (the arrangement direction of a lens array). This phenomenon is attributable to the surface tension acting on the surface of the molten resin in the heat flow process. If a resin layer is patterned to form substantially rectangular parallelepiped blocks (FIG. 4B) and then the resin is melted in the heat flow process, the molten resin located at the corner portions as viewed in the XY direction (the diagonal direction) is attracted to the center due to the surface tension. As a result, the resin lens becomes thin and smooth in the XY direction (the diagonal direction of the lens array). By forming a transparent resin layer 31 on the resin lens 21c, the lens curvature of a micro lens 40 is improved in the XY direction, so that the convergence characteristic can be improved in the same direction. In addition, the transparent resin helps to increase the lens area, thereby improving the opening rate. If the transparent resin is coated without forming the ditches 22, the transparent resin will fill the regions between the resin lenses 21c, widening the gap between the micro lenses 40. This phenomenon is particularly marked in the X or Y direction (the arrangement direction) in which the distance between the lenses is short). However, if the ditches 22 are formed first and then the transparent resin is coated, the extra transparent resin, which causes the enlargement of the gap between the micro lenses 40, flows into the ditches 22 and therefore does not widen the gap between the micro lenses 40. Hence, the gap between the lenses can be as narrow as possible. As can be understood from this, the function of the ditches 22 is to prevent the transparent resin from filling the regions between the lenses, thereby attaining a narrow gap between the lenses.

Specially, when the transparent resin 31 covers the ditch 22, the ditch 22 extending in the side direction of the micro lens array (X- or Y-direction) tends to be filled up more easily than the ditch 22 extending in the diagonal direction of the micro lens array (XY-direction), because the ditch 22 extending in the XY-direction is larger than the ditch 22 extending in the X- or Y-direction. Therefore, in order to control the gap between adjacent micro lenses 40 in the side direction of the micro lens array and perform the small gap between adjacent micro lenses 40, it is necessary to control the properties of the coating solution and the coating conditions. In addition, it is desirable that the depth of the ditch 22 falls within a range of between 1.5 μm and 0.05 μm in order to suppress the nonuniformity of the coating of the transparent resin. Incidentally, in the present embodiment, it is necessary to set in advance the gap in the side direction of the resin lens 21c for forming the micro lens 40 at a level not larger than 0.6 μm, e.g., at 0.5 μm to 0.3 μm.

(Control of the Thickness of the Transparent Resin Layer 31)

How to control the thickness of that portion of the transparent resin layer 31 which is positioned in the ditch 22 to decrease a noise light such as smear will now be described with reference to FIGS. 1, 3A and 3B.

Specifically, FIG. 3A is a cross sectional view along the line B—B shown in FIG. 1 showing the undercoat layer 17 and the micro lens 40, and FIG. 3B is a cross sectional view along the line C—C shown in FIG. 1 showing the undercoat layer 17 and the micro lens 40.

In the solid image-pickup device, the thickness Dxy of the transparent resin layer 31 shown in FIG. 3B, which covers the ditch 22 extending in the diagonal direction of the micro lens array, is set smaller than the thickness D of the transparent resin layer 31 shown in FIG. 3A, which extends in the side direction of the micro lens array. For example, the thickness Dxy of the transparent resin layer 31 shown in FIG. 3B is set smaller by about 0.4 μm than the thickness D of the transparent resin layer shown in FIG. 3A. The thickness Dxy of the transparent resin layer 31 covering the ditch 22 in the diagonal direction can be controlled by controlling the etching amount of the undercoat layer 17 after formation of the resin lens 21c, the thickness of the transparent coating resin solution coated, and the properties of the transparent resin coating solution. According to the experiments of the inventors, it is preferable that the depth of the ditch 22 is set at, for example, 1.5 to 0.05 μm, and the thickness of the transparent resin layer 31 positioned on the resin lens 21c is set at, for example, 0.3 to 0.01 μm.

In general, the noneffective portion which does not contribute light receiving, i.e. the surface of the portion of the transparent resin layer 31 burying the ditch 22, has a large area ratio. If the noneffective portion noted above is formed flat, the light input to the noneffective portion is reflected the surface of the transparent resin layer 31. The light reflected from the surface of the noneffective portion is reflected again from the cover glass of the solid image-pickup device (not shown) and, then, is incident again in the solid image-pickup device so as to cause a noise light such as smear, thereby deteriorating the characteristics of the solid image-pickup device. However, if the thickness Dxy of the transparent resin layer 31 covering the ditch 22 between adjacent micro lenses 40 in the diagonal direction of the micro lens array is made smaller than the thickness D, suppressing of the reflection of the light on the surface of the noneffective portion can be performed. Consequently, the characteristics of the solid image-pickup device can be markedly improved.

In other words, the depth of the surface of the transparent resin layer 31 in the ditch 22 in the diagonal direction form the top of the micro lenses 40 is deeper than the depth of the of the surface of the transparent resin layer 31 in the ditch 22 in the arranging direction form the top of the micro lenses 40.

With this configuration, it is possible to improve the light collecting effect in the diagonal direction of the micro lens 40.

Furthermore, in the solid image-pickup device of the present invention, the thickness of the transparent resin layer 31 covering the ditch 22 is controlled to perform the small gap between the adjacent micro lenses 40. Now, The gap between adjacent micro lenses is determined on the basis of the curvature of the micro or resin lenses. To be more specific, two kinds of distances are defined between the points of inflection on the curves of the lenses, and, of the two, the shorter distance represents the gap between adjacent micro lenses (the longer distance represents the size of the opening).

The thickness of the transparent resin layer 31 and the state of burying the ditch 22 with the transparent resin layer 31 after coating of the transparent resin are affected by, for example, the polarity of the solvent used, the agglomerating force of the resin used, the thixotropic properties, the presence or absence and the addition amount of a surfactant, the liquid temperature, the substrate temperature, the conditions of the undercoat layer, and the coating conditions. Specially, in order to reproduce in the sub-micron region the gap between adjacent micro lenses, it is necessary to determine the sufficient conditions. As a result of an extensive research, the present inventors have found that it is necessary for the transparent resin layer 31 to have a thickness not larger than 0.3 $\mu$m in order to reproduce in the sub-micron region the gap between adjacent micro lenses 40 in the side direction or the micro lens array. If the thickness of the transparent resin layer 31 exceeds 0.3 $\mu$m, the ditch 22 between adjacent resin lenses 21c is filled up too much, resulting in failure to obtain a narrow gap. Also, where the thickness of the transparent resin layer 31 is not larger than 0.03 $\mu$m, the coating solution of the resin forms a thin solution and, thus, is rendered unstable, resulting in failure to form a uniform film in the coating step.

Accordingly, with this configuration, the transparent resin layer 31 covering the resin lens 21c and the ditch 22 can be formed by a simple method of a low cost such as a spin coating of a transparent resin without relying on a costly method such as a vacuum film formation.

(General Description of Method for Manufacturing Solid Image-pickup Device)

The manufacturing method of the solid image-pickup device will now be described with reference to the accompanying drawings. Specifically, FIGS. 4A to 4E are cross sectional views corresponding to FIG. 2 and collectively showing the manufacturing method of the solid image-pickup device. Incidentally, the portion ranging between the planarized layer 16 in FIG. 4A and the semiconductor substrate 11 is omitted in FIGS. 4B to 4D.

Figure 4A:
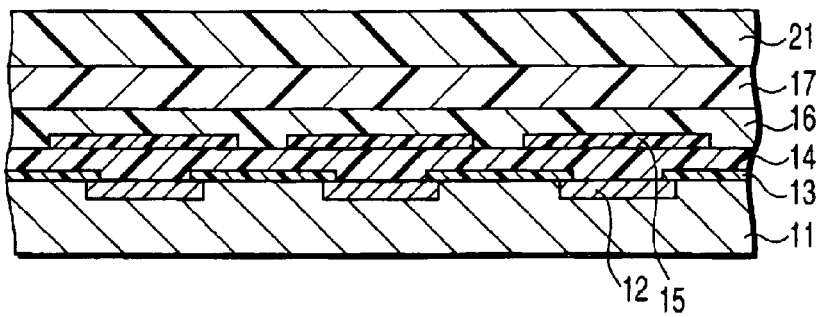
FIGS. 4A to 4E are cross sectional views collectively showing a method according to one embodiment of the present invention of manufacturing a solid image-pickup device of the present invention.

In the first step, the semiconductor substrate 11 having the photovoltaic element 12 and the light shielding portion 13 formed thereon is coated with a transparent resin solution with a spinner so as to form the planarized layer 14 having a predetermined thickness. Then, color filters 15 of red, green and blue are formed on the planarized layer 14, followed by forming the planarized layer 16 having a predetermined thickness in a manner to cover the color filters 15 and the exposed portion of the planarized layer 14 and subsequently forming the undercoat layer 17 on the planarized layer 16. Further, the upper surface of the undercoat layer 17 is coated with a photosensitive resin solution containing the base material of the resin lens with a spinner so as to form a photosensitive resin layer 21 as shown in FIG. 4A.

Figure 4B:
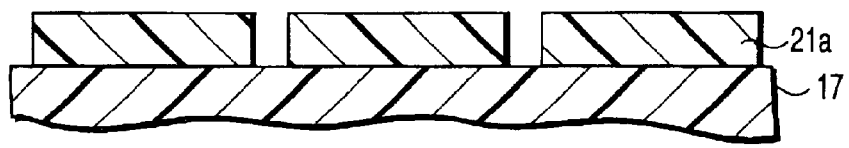

In the next step, a series of patterning treatments including the light exposure and development are applied to the photosensitive resin layer 21 by using a photomask having a predetermined pattern so as to form a resin pattern layer 21a on the undercoat layer 17, as shown in FIG. 4B.

Figure 4C:
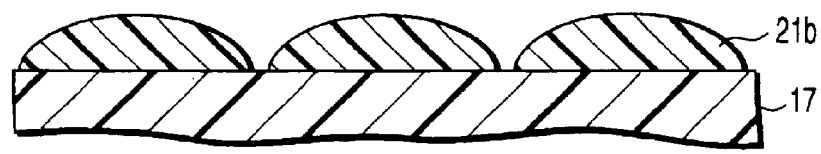

Then, the resin pattern layer 21a is heated and softened at a predetermined temperature so as to form the resin lens 21b shaped like a convex lens, as shown in FIG. 4C.

Figure 4D:
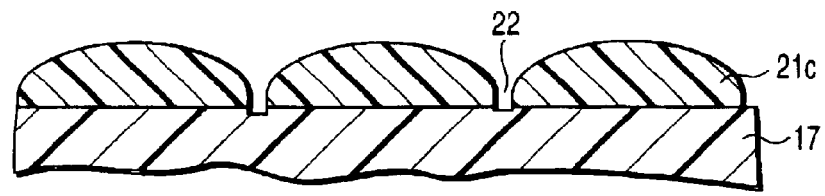

After formation of the resin lenses 21b, the undercoat layer 17 positioned between adjacent resin lenses 21b is etched by, for example, an ashing or a dry etching method with the resin lenses 21b used as a resist mask so as to form the ditches 22, as shown in FIG. 4D. It is desirable to apply a strongly anisotropic etching treatment for forming the ditches 22.

It is desirable for the depth of the ditch 22 to fall within a range of between 0.05 $\mu$m and 1.5 $\mu$m.

Also it is desirable to select a resin of the undercoat layer 17 having an etching rate higher than (for example, about three times) that of the base material of the resin lens 21b for forming the undercoat layer 17. This selection is in order to retain the shape of the resin lens 21b. Further, it is important to select a material satisfying the optical characteristics such as the refractive index as the base material of the resin lens 21b.

In the next step, the surfaces of the resin lenses 21b and the ditches 22 are coated by, for example, a spinner with a predetermined transparent resin solution so as to form the transparent resin layer 31. Note that, the transparent resin layer 31 is formed such a manner that the thickness on the resin lenses 21c, the thickness (D) on the ditch 22 in the X- and Y-directions direction, and each of the thickness (Dxy) on the ditch 22 in the XY-direction direction shown in FIG. 1, is performed a predetermined thickness respectively. Through the processes described above, obtained is a solid image-pickup device of the present invention comprising the micro lenses 40 and the micro lens array 50, as shown in FIG. 4E.

Incidentally, it is possible to add a surfactant to the coating solution in order to improve the coating properties and the dispersion capability. It is also possible to mix a plurality of different solvents or to add another resin having a different molecular weight. Further, it is possible to apply slightly an etching treatment, a plasma treatment, an ultraviolet light washing, etc. as pretreatments before the coating step.

Figure 4E:
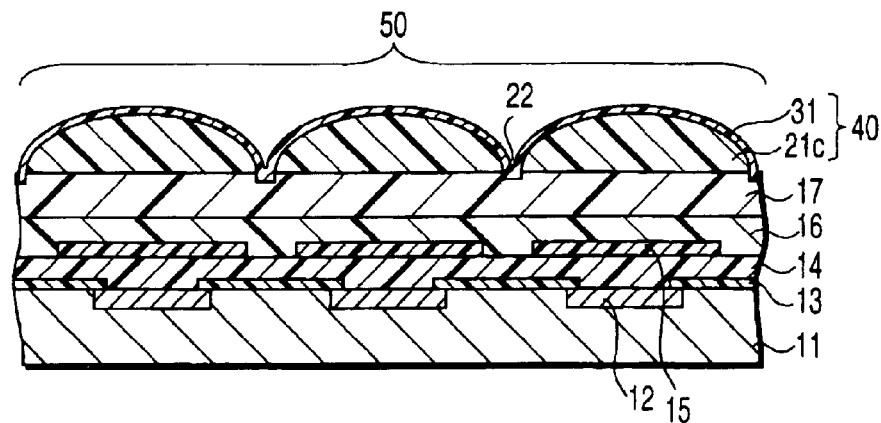

It is characteristic of the solid image-pickup device as shown in FIG. 4E or FIG. 2 that the gap between the adjacent micro lenses 40 in the X- or Y-direction is controlled in such a manner to fall within a range of between 0.005 $\mu$m and 0.3 $\mu$m. In addition, it is important that the thickness Dxy of the transparent resin layer 31 between the micro lenses 40 in the XY-direction is smaller than the thickness D of the transparent resin layer 31 between the micro lenses 40 in the X- or Y-direction.

In the manufacturing method described above, the technology of the semiconductor level, which handles a pattern sized not larger than 0.3 μm, is fully utilized, making it possible to set, for example, the gap between adjacent resin lenses 21c at 0.6 μm or less and to set the thickness of the photosensitive resin layer 21 at 0.3 μm or less. As a result, a small gap between adjacent micro lenses 40 can be achieved very easily.

(Example of Manufacturing Method)

An example of the manufacturing method will now be described in detail.

In the first step, the planarized layer 14, the color filter 15 and the planarized layer 16 are formed successively on the semiconductor substrate 11 having the photovoltaic element 12 and the light shielding portion 13 formed therein in advance, followed by forming a layer of an epoxy series resin solution on the planarized layer 16 by a spin coating method so as to form the undercoat layer 17.

Then, a phenolic photosensitive resin solution (380H: manufactured by JSR) is coated over the undercoat layer 17 by a spinner, followed by drying the coating so as to form the photosensitive resin layer 21 having a thickness of 1.2 μm.

In the next step, a series of patterning treatments including the light exposure and development is applied to the photosensitive layer 21 by using a photomask having a predetermined pattern so as to form the resin pattern layers 21a on the undercoat layer 17. The resin pattern layers 21a are formed at a pitch of 5 μm and with a gap between adjacent resin pattern layers 21a set at 0.6 μm so as to correspond to the arrangement of the photovoltaic elements 12.

Then, heating is applied at 180° C. for 3 minutes on a hot plate so as to perform a heat flow treatment, thereby forming the resin lenses 21b each having a lens height of 1.5 μm on the undercoat layer 17. The gap between adjacent resin lenses 21b in the side direction is 0.4 μm.

In the next step, an oxygen gas is introduced into a dry etching apparatus to set up an inner pressure of 20 Pa within the dry etching apparatus, and an etching treatment is performed for 25 seconds with the substrate kept at room temperature and with the RF power set at 1 kw so as to form the resin lenses 21c having a lens height of 1.5 μm with the gap between adjacent resin lenses 21c set at 0.5 μm in the side direction and the ditches 22 having a depth of 0.3 μm. The resins for forming the undercoat layer 17 and the resin lens 21c are selected such that the etching rate of the undercoat layer 17 is 3 times as high as that of the resin lens 21c.

Finally, the transparent resin layer 31 having a thickness of 0.1 μm is formed on the resin lens 21c by the spin coating of a thermosetting phenolic resin solution, thereby obtaining a solid image-pickup device comprising the micro lens array 50 consisting of a plurality of micro lenses 40 arranged with a gap of 0.1 μm set between adjacent micro lenses 40.

According to the experiments of the inventers, in the solid image-pickup device of the present invention thus obtained, the thickness D of the transparent resin layer 31 between adjacent micro lenses 40 in the side direction of the micro lens array 50 is found to be 0.5 μm. Also, the thickness Dxy of the transparent resin layer 31 between adjacent micro lenses 40 in the diagonal direction of the micro lens array 50 is found to be 0.1 μm. Further, the opening rate is found to be 96%, which is markedly higher than the opening rate of 64% for the conventional solid image-pickup device.

The sensitivity and the opening rate are remarkably improved and, at the same time, the extra reflection of the light incident obliquely on the solid image-pickup device is moderated. Therefore, a solid image-pickup device of a high image quality that permits eliminating the smear can be obtained.

The solid image-pickup device of the present invention described above produces prominent effects as described below.

First of all, the micro lens array used in the solid image-pickup device of the present invention is formed by forming in advance the ditches between adjacent resin lenses. The ditches is formed, followed by laminating a thin resin layer having a thickness not larger than 0.3 μm, with the result that the narrow gap between the adjacent micro lenses is performed. It follows that it is possible to provide a solid image-pickup device of a high precision and a high performance comprising more than 2,000,000 pixels.

Also, in the present invention, it is possible to control the thickness of the transparent resin layer between adjacent micro lenses in the side direction and diagonal direction of the micro lens array, making it possible to supplement the lens function and to eliminate the noise derived from the reflected light.

Further, according to the manufacturing method of the present invention, the micro lenses can be formed by the simple process such as the spin coating and the etching, making it possible to prepare the micro lenses of a high precision with a high stability and a good reproducibility. It follows that it is possible to avoid the nonuniformity that tends to be generated in the manufacture of a high precision solid image-pickup device.

What should also be noted is that, in the micro lens forming process of the present invention, a costly vacuum equipment is used in only the etching process (or ashing process) performed for a short time, leading to an improved through-put. It follows that a solid image-pickup device can be manufactured with a low cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid image-pickup device, comprising:
   a lens array formed by arranging a plurality of resin lenses in a manner to form a matrix;
   an undercoat layer for fixing said lens array and having a ditch formed between said adjacent resin lenses; and
   a transparent resin layer covering said plural resin lenses with substantially the same thickness and the ditch between said adjacent resin lenses,
   wherein a micro lens array is formed which comprises a plurality of micro lenses arranged in a matrix, the micro lenses including the resin lenses and parts of the transparent resin layer which cover the resin lenses, respectively, and
   wherein a minimum thickness of said transparent resin layer in the ditch between said adjacent resin lenses in a diagonal direction of said lens array is smaller than a minimum thickness of said transparent resin layer in the ditch between adjacent resin lenses in an arranging direction of said lens array.

2. The solid image-pickup device according to claim 1, wherein a gap in the arranging direction of said lens array between adjacent micro lenses each consisting of said resin lenses and said transparent resin layer covering the surface of said resin lenses falls within a range of between 0.005 μm and 0.3 μm.

3. The solid image-pickup device according to claim 1, wherein the thickness of said transparent resin layer on the surface of said resin lens falls within a range of between 0.01 μm and 0.3 μm, and the depth of said ditch falls within a range of between 0.05 μm and 1.5 μm.

4. The solid image-pickup device according to claim 1, wherein said undercoat layer is formed of a transparent resin having an etching rate higher than that of said resin lens.

5. The solid image-pickup device according to claim 1, wherein a gap between adjacent resin lenses in the arranging direction of said lens array is not larger than 0.6 μm.

6. A solid image-pickup device, comprising:
a lens array formed by arranging a plurality of resin lenses in a manner to form a matrix;
an undercoat layer for fixing said lens array and having a ditch formed between adjacent resin lenses; and
a transparent resin layer covering said plural resin lenses and said ditch,
wherein a micro lens array is formed which comprises a plurality of micro lenses arranged in a matrix, the micro lenses including the resin lenses and parts of a transparent resin layer which covers each of the resin lenses, respectively,
wherein a difference between a height of a surface of said transparent layer in the ditch in a diagonal direction of said lens array and a height of tops of said micro lenses each consisting of said resin lens and said transparent resin layer covering a surface of said resin lens is larger than a difference between the height of the surface of said transparent layer in the ditch in an arranging direction of said lens array and the height of the tops of said micro lenses.

7. The solid image-pickup device according to claim 6, wherein the gap between adjacent micro lenses in the arranging direction of said lens array falls within a range of between 0.005 μm and 0.3 μm.

8. The solid image-pickup device according to claim 6, wherein the thickness of said transparent resin layer on the surface of said resin lens falls within a range of between 0.01 μm and 0.3 μm, and the depth of said ditch falls within a range of between 0.05 μm and 1.5 μm.

9. The solid image-pickup device according to claim 6, wherein said undercoat layer is formed of a transparent resin having an etching rate higher than that of said resin lens.

10. The solid image-pickup device according to claim 6, wherein the gap between adjacent resin lenses in the arranging direction of said lens array is not larger than 0.6 μm.

11. A method of manufacturing a solid image-pickup device, comprising:
forming a photosensitive resin layer on an undercoat layer;
exposing said photosensitive resin layer to light in a predetermined pattern, followed by a developing treatment so as to form a resin pattern layer having a predetermined gap width;
subjecting said resin pattern layer to a heat flow so as to form a resin lens array which is 2-dimensionally arranged a plurality of resin lenses;
applying an etching treatment to those portions of said undercoat layer which are exposed in regions between adjacent resin lenses to form ditches; and
forming a transparent resin layer on surfaces of said resin lenses and said undercoat layer,
wherein a minimum thickness of said transparent resin layer in a ditch between said adjacent resin lenses in a diagonal direction of said resin lens array is smaller than a minimum thickness of said transparent resin layer in the ditch between said adjacent resin lenses in an arranging direction of said resin lens array.

12. The method of manufacturing a solid image-pickup device according to claim 11, wherein said ditches are formed in a depth falling within a range of between 0.05 μm and 1.5 μm.

13. The method of manufacturing a solid image-pickup device according to claim 11, wherein the gap width between adjacent resin lenses in the arranging direction of said resin lens array after formation of said ditches is not larger than 0.6 μm.

14. The method of manufacturing a solid image-pickup device according to claim 11, wherein said transparent resin layer is formed on the surfaces of said resin lenses in a thickness falling within a range of between 0.01 μm and 0.3 μm.

15. The method of manufacturing a solid image-pickup device according to claim 11, wherein said transparent resin layer is formed to cover the surfaces of said resin lenses such that portions of said transparent resin layer which cover the surfaces of said resin lenses have substantially a same thickness and cover a surface of said undercoat layer which includes the ditches.

16. A solid image-pickup device, comprising:
a micro lens array formed by a plurality of resin micro lenses arranged in a matrix;
an undercoat layer to fix said micro lens array and having a ditch formed between adjacent said resin micro lenses; and
a transparent resin layer covering said plural resin micro lenses with substantially the same thickness and the ditch between said adjacent resin micro lenses,
wherein a minimum thickness of said transparent resin layer in the ditch between said adjacent resin micro lenses in a diagonal direction of said micro lens array is smaller than a minimum thickness of said transparent resin layer in the ditch between said adjacent resin micro lenses in an arranging direction of said micro lens array.

* * * * *

UNITED STATES PATENT AND TRADEMARK OFFICE
CERTIFICATE OF CORRECTION

PATENT NO. : 6,950,140 B2
APPLICATION NO. : 09/768454
DATED : September 27, 2005
INVENTOR(S) : Kenzo Fukuyoshi et al.

Page 1 of 1

It is certified that error appears in the above-identified patent and that said Letters Patent is hereby corrected as shown below:

On the title page, and colum 1, lin-1; Item [54]: (Title), delete "SOLID IMAGE-BACKUP DEVICE HAVING A MICRO LENS ARRAY AND METHOD OF MANUFACTURING THE SAME" and insert - - " MICRO LENS ARRAY INCLUDING AN ETCHED DITCH AND TRANSPARENT RESIN LAYER AND METHOD OF MANUFACTURING SAME" - -, therefor.

Signed and Sealed this

Eighth Day of August, 2006

JON W. DUDAS
*Director of the United States Patent and Trademark Office*